(12) United States Patent
Gong et al.

(10) Patent No.: US 12,364,174 B2
(45) Date of Patent: Jul. 15, 2025

(54) GLOBAL HEATER FOR PHASE CHANGE MEMORY

(71) Applicant: International Business Machines Corporation, Armonk, NY (US)

(72) Inventors: Nanbo Gong, White Plains, NY (US); Takashi Ando, Eastchester, NY (US); Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 699 days.

(21) Appl. No.: 17/545,195

(22) Filed: Dec. 8, 2021

(65) Prior Publication Data
US 2023/0180644 A1    Jun. 8, 2023

(51) Int. Cl.
H10N 70/00    (2023.01)
G11C 13/00    (2006.01)
H10B 63/00    (2023.01)
H10N 70/20    (2023.01)

(52) U.S. Cl.
CPC ..... *H10N 70/8413* (2023.02); *G11C 13/0004* (2013.01); *G11C 13/0069* (2013.01); *H10B 63/80* (2023.02); *H10N 70/021* (2023.02); *H10N 70/231* (2023.02); *H10N 70/826* (2023.02); *H10N 70/883* (2023.02); *G11C 2013/008* (2013.01); *H10N 70/841* (2023.02)

(58) Field of Classification Search
CPC ............ G11C 13/0004; G11C 13/0069; G11C 2013/008; H10N 70/8413; H10N 70/826; H10N 70/883; H10N 70/231; H10N 70/021; H10N 70/841

USPC ........................................................ 365/163
See application file for complete search history.

(56) References Cited

U.S. PATENT DOCUMENTS

| 7,671,355 | B2 | 3/2010 | Kuo |
| 10,790,444 | B2 | 9/2020 | Tsai |
| 2008/0096344 | A1 | 4/2008 | Lai |
| 2008/0258126 | A1 | 10/2008 | Lung |

(Continued)

FOREIGN PATENT DOCUMENTS

| CN | 101000945 A | 7/2007 |
| CN | 111969105 A | 11/2020 |

(Continued)

OTHER PUBLICATIONS

Ielmini, Daniele, "Threshold switching mechanism by high-field energy gain in the hopping transport of chalcogenide glasses", Physical Review B, vol. 78, Issue 3, Jul. 8, 2008, 8 pages.

(Continued)

*Primary Examiner* — Sung Il Cho
(74) *Attorney, Agent, or Firm* — Aams N. Pontika (57) ABSTRACT

Embodiments of the present invention include a phase change memory (PCM) array. The PCM array may include a plurality of PCM cells. Each PCM cell in the plurality of PCM cells may include a top electrode, a resistive element, and a bottom electrode. The PCM array may also include a global heater surrounding the plurality of PCM cells having a thermally conductive material contacting each of the plurality of PCM cells. The global heater may be configured to receive an electric signal to heat the plurality of PCM cells simultaneously.

20 Claims, 4 Drawing Sheets

(56) References Cited

U.S. PATENT DOCUMENTS

| | | | |
|---|---|---|---|
| 2009/0072214 A1 | 3/2009 | Sun | |
| 2009/0161406 A1* | 6/2009 | Chuang | H10B 63/20 |
| | | | 438/102 |
| 2010/0144090 A1 | 6/2010 | Song | |
| 2010/0258777 A1* | 10/2010 | Li | G11C 13/0004 |
| | | | 257/E47.001 |
| 2014/0266300 A1 | 9/2014 | Sherwin | |
| 2016/0079019 A1 | 3/2016 | Borodulin | |
| 2019/0067570 A1* | 2/2019 | Tsai | H10B 63/80 |
| 2020/0058848 A1 | 2/2020 | El-Hinnawy | |
| 2022/0344582 A1* | 10/2022 | Lin | H10N 70/841 |

FOREIGN PATENT DOCUMENTS

| | | |
|---|---|---|
| EP | 2034536 B1 | 11/2010 |
| KR | 100876767 B1 | 1/2009 |
| TW | 201324757 A | 6/2013 |

OTHER PUBLICATIONS

International Searching Authority, "Notification of Transmittal of the International Search Report and the Written Opinion of the International Searching Authority, or the Declaration", File Reference P201908780, International application No. PCT/EP2022/083342, International Filing Date Nov. 25, 2022, Mailed on Mar. 20, 2023, 12 pages.

\* cited by examiner

GLOBAL HEATER FOR PHASE CHANGE MEMORY

BACKGROUND

The present invention relates generally to the field of integrated circuits (i.e., computer chips, or simply chips), and more particularly to providing a global heater for reducing threshold voltage of phase change memory.

Phase-change memory (PCM) is a type of non-volatile random-access memory. A PCM cell utilizes chalcogenide glass as a resistive element between electrodes. In operation, an electric current is passed through a heating element for each PCM cell, which heats the glass. The glass may then be quenched or held in a temperature range for a certain amount of time. Quenching the glass leaves the resistive element in an amorphous state with one resistance, while on the other hand, holding the glass within a temperature range gives the resistive element a crystalline state with a different resistance. A PCM cell may also be heated and cooled to achieve distinct intermediary states, thereby having the ability to hold multiple bits in a single cell, but the difficulties in programming cells in this way has prevented these capabilities from being implemented in other technologies with the same capability.

SUMMARY OF THE INVENTION

Embodiments of the present invention include a phase change memory (PCM) array. The PCM array may include a plurality of PCM cells. Each PCM cell in the plurality of PCM cells may include a top electrode, a resistive element, and a bottom electrode. The PCM array may also include a global heater surrounding the plurality of PCM cells having a thermally conductive material contacting each of the plurality of PCM cells. The global heater may be configured to receive an electric signal to heat the plurality of PCM cells simultaneously.

Embodiments of the present invention may also include a method of forming a phase change memory array. The method may include forming a plurality of phase change memory (PCM) cells. Each PCM cell in the plurality of PCM cells may include a top electrode, a resistive element, and a bottom electrode. The method may also include forming a global heater having a thermally conductive material surrounding the plurality of PCM cells. The global heater may be configured to receive an electric signal to heat the plurality of PCM cells simultaneously.

Embodiments of the present invention may also include a method. The method may include signaling a global heater to heat a phase change memory (PCM) array, storing machine learning values in the PCM array by propagating a signal through PCM cells of the PCM array to change resistance of the PCM cells, signaling the global heater to cease heating the PCM array; and inferencing the PCM array

DETAILED DESCRIPTION

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

The present invention will now be described in detail with reference to the Figures.

Figure 1:
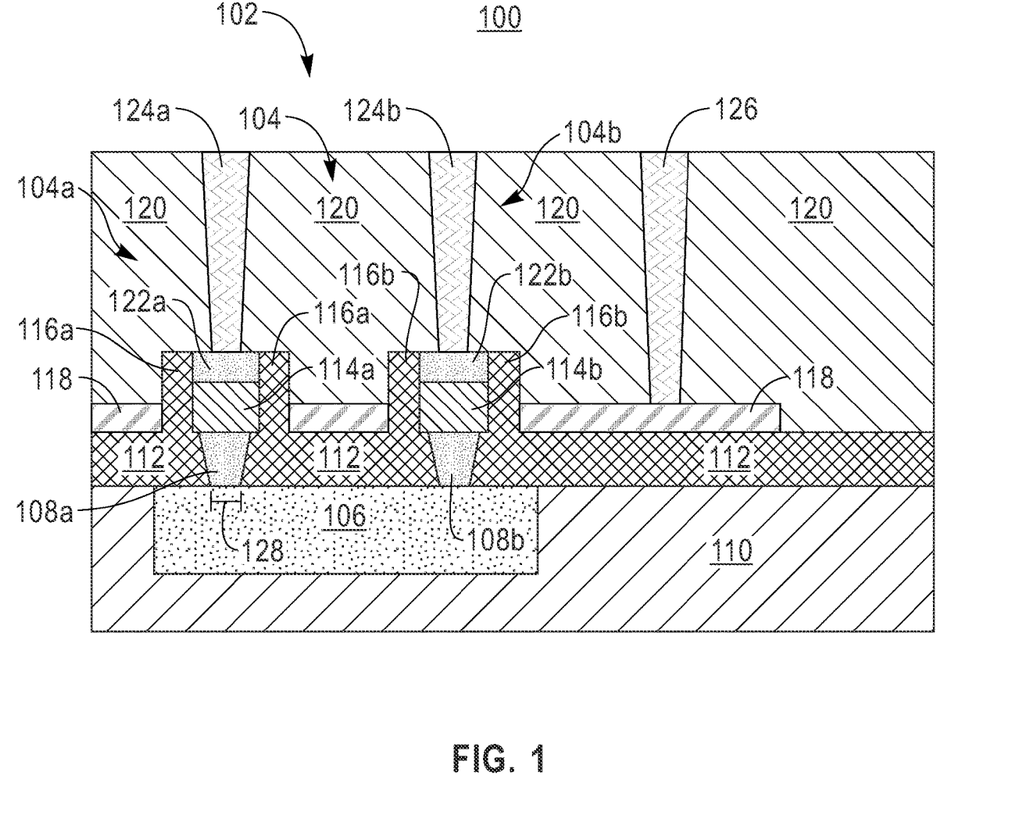
FIG. 1 depicts a cross-sectional side view of a semiconductor structure 100, in accordance with one embodiment of the present invention.

FIG. 1 is a cross-sectional view of a semiconductor structure 100, in accordance with one embodiment of the present invention. FIG. 1 provides only an illustration of one implementation and does not imply any limitations with regard to the different embodiments that may be implemented. Many modifications to the depicted embodiment may be made by those skilled in the art without departing from the scope of the invention as recited by the claims. The semiconductor structure 100 may include a phase change memory (PCM) array 102 having a plurality of PCM cells 104. In the illustrated embodiment, only two PCM cells 104 are shown (i.e., a first PCM cell 104a and a second PCM cell 104b), but the PCM array 102 may include thousands or millions of PCM cells 104 for use in, for example, machine learning. In the illustrated embodiment, PCM cells 104 include a bottom wire 106, bottom electrodes 108a, b, a substrate 110, insulator 112, PCM materials 114a, b, spacers 116a, b, global heater 118, interlayer dielectric (ILD) 120, top electrodes 122a, b, top wires 124a, b, and heater wire 126.

In the illustrated embodiment, the bottom of bottom electrode 108 is in direct contact with and electrically connected to the top of bottom wire 106, which can receive electrical signals from other components (not shown) of the integrated circuit. The bottom of the PCM materials 114a, b are in direct contact with and electrically and thermally connected to the top of the bottom electrodes 108a, b. The bottom of the top electrodes 122a, b are in direct contact with and electrically and thermally connected to the top of the PCM materials 114a, b. The bottom of the top wires 124a, b are in direct contact with and electrically connected to the top of the top electrodes 122a, b, and the top wires 124a, b can deliver electrical signals from the PCM cells 104a, b to other components (not shown) of the semiconductor structure 100.

In the illustrated embodiment, the spacers 116a, b are in direct contact with and laterally surround the outer sides of PCM materials 114a, b and at least a portion of the top electrodes 122a, b. As such, the spacers 116 enclose the PCM materials 114a, b on all parallel sides in at least one direction (e.g., the sides that extend vertically, as shown in FIG. 1). In some embodiments, the spacers 116a, b laterally surround all of the sides of top electrode 122, although in other embodiments, the spacers 116a, b are coterminous with the top of PCM material 114.

In the illustrated embodiment, the substrate 110, the insulator 112, and the ILD 120 structurally support and electrically isolate the other components of PCM cell 104, selectively, and fill in the space therebetween, as appropriate. Thus, the outer side of the bottom electrodes 108a, b are in direct contact with and laterally surrounded by the insulator 112, and the outer sides of the bottom wire 106 are in direct contact with and laterally surrounded by the substrate 110. In the illustrated embodiment, a cross-sectional of the PCM cells 104a, b (i.e., looking down from above the PCM cells 104a, b) can be circular, although in other embodiments, it can be rectangular, square, oval, or any other suitable shape.

In the illustrated embodiment, the substrate 110, the insulator 112, and the ILD 120 may include dielectric (electrical insulating) material, such as, for example, silicon nitride (SiN), silicon oxide ($SiO_2$), silicon nitride carbide (SiNC), or tetraethyl orthosilicate (TEOS). In some embodiments, all of the substrate 110, the insulator 112, and the ILD 120 may include the same material, and in other embodiments, different materials are used for some or all of the substrate 110, the insulator 112, and the ILD 120. In addition, the spacers 116a, b may be fabricated using a reactive-ion-etching-resistant (RIER) material, such as, for example, aluminum nitride (AlN), aluminum oxide ($Al_2O_3$), or aluminum oxynitride ($AlO_xN_y$).

In the illustrated embodiment, the PCM materials 114a, b are composed essentially of a phase change material such as a germanium-antimony-tellurium (GST), gallium-antimony-tellurium (GaST), or silver-iridium-antimony-telluride (AIST) material, although other materials can be used as appropriate. Examples of other PCM materials can include, but are not limited to, germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, Ge—Te alloys and combinations thereof. The PCM materials 114a, b may be undoped or doped (e.g., doped with one or more of oxygen (O), nitrogen (N), silicon (Si), carbon (C), or titanium (Ti)). The terms "composed essentially" and "consist essentially," as used herein with respect to materials of different layers, indicates that other materials, if present, do not materially alter the basic characteristics of the recited materials. For example, if the PCM materials 114a, b consist essentially of GST material, then the PCM materials 114a, b do not include other materials that materially alter the basic characteristics of the GST material.

In the illustrated embodiment, the bottom electrode 108a, b, the global heater 118, and the top electrode 122 may include an electrically conductive material, such as metal or metallic compound. Specific examples may include titanium nitride (TiN) or tungsten (W). The bottom electrode 108 and the global heater 118 may include compounds of a higher resistance metal, such as, for example, titanium tungsten (TiW), tantalum nitride (TaN), or titanium aluminide (TiAl). The bottom electrodes 108a, b may also be fabricated with a relatively narrow cross-sectional area 128, which focuses electrical current that is run through PCM cell 100. This allows the bottom electrodes 108a, b to generate heat through resistive heating during a pulse of electricity, which can be used to selectively change the temperature of the PCM materials 114a, b, for example, above the crystallization temperature and the melting temperature of the PCM materials 114a, b. In addition, the bottom electrodes 108a, b may include multiple different electrically conductive materials that can be arranged in multiple layers.

The global heater 118 may include a thermally conductive material that improves the ability of the bottom electrodes 108a, b to change the temperature of the PCM material 114a, b by heating the PCM array 102 globally. The global heater 118 receives a current through the global heater wire 126, and heats the insulator 112 and the spacers 116a, b due to the resistance of the metal compound. The heating may be carefully controlled such that the PCM materials 114a, b are heated to a temperature that is close to, but still below, the melting point of the PCM materials 114a, b. Therefore, rather than heating the PCM materials 114a, b from room temperature to the melting point, the bottom electrodes 108a, b are only required to raise the temperature a few degrees, which can be accomplished with a signal having a lower current.

The lower current requirement means that the PCM cells 104a, b can perform at faster processing speeds and with reduced power consumption.

After the melting signal is passed through the PCM cells 104a, b, the PCM materials 114a, b will cool and solidify with resistance values that depends on the signal strength and the material properties of the PCM materials 114a, b. The semiconductor structure 100 may utilize these resistance values to operate the PCM cells 104a, b as a memory cell: for example by passing an electrical current pulse from the bottom electrodes 108a, b to the top electrode 122a, b to program the PCM cells 104a, b. This can be done at a variety of voltages and/or for a variety of durations to read or write a value on the PCM cells 104a, b. For example, to write, a high voltage can be used (e.g., 1 volt (V) to 4 V) for a short duration, which can cause the bottom electrodes 108a, b to locally heat the PCM materials 114a, b beyond its melting point. Once the flow of current ceases, PCM material 114 can cool down rapidly, which forms an amorphous zone in a process called "resetting". The creation of the amorphous zone can cause the electrical resistance across the PCM cells 104a, b to increase as compared to a solely polycrystalline configuration. These resistance values of the PCM cells 104a, b can be read without changing the state of the PCM materials 114a, b or the resistance value of the PCM cells 104a, b, for example, by sending a current pulse at a low voltage (e.g., 0.2 V) from bottom electrodes 108a, b to the top electrodes 122a, b.

In addition, the PCM materials 114a, b can be rewritten and returned back to a solely polycrystalline configuration by "setting" the PCM cells 104a, b. One way to rewrite the PCM materials 114a, b uses a high voltage electrical pulse (e.g., 1 V to 4 V) for a short period of time (e.g., 10 nanoseconds (ns)), which can cause the PCM materials 114a, b to heat up beyond its crystallization point but not to its melting point. Since the crystallization temperature is lower than the melting temperature, once the flow of current ceases, the PCM materials 114a, b can anneal and form crystals. Another way to rewrite the PCM materials 114a, b uses an electrical pulse with a relatively long trailing edge (e.g., 1 microsecond) (as opposed to a square pulse with a relatively short trailing edge on the order of nanoseconds) that is strong enough to heat the PCM materials 114a, b beyond its melting point, after which, the PCM materials 114a, b are cooled down slowly, allowing crystals to form. Either of these processes cause the electrical resistance across the PCM cells 104a, b to decrease as compared to having an amorphous zone. This new resistance value can then be read using current at a low voltage (e.g., 0.2 V) without changing the state of the PCM materials 114a, b or the resistance value of the PCM cell 104a, b.

In some embodiments, the melting temperature of the PCM materials 114a, b is about 600° C. In some embodiments, the crystallization temperature of the PCM materials 114a, b is about 180° C. In addition, the process of setting and resetting the PCM cells 104a, b can occur repeatedly, and in some embodiments, different zones with different resistances can be created in the PCM materials 114a, b (e.g., due to having different sizes of the amorphous zone and/or amounts of crystallization nuclei in the amorphous zone). This allows for the PCM cells 104a, b to have various distinct resistances that can be created by varying the resetting parameters. Thereby, if the PCM cells 104a, b are considered to represent information digits, these digits can be non-binary (as opposed to traditional bits). However, in some embodiments, the PCM cells 104a, b can be used as a bit by either having or not having a uniform zone in the PCM materials 114a, b. In such embodiments, the PCM cells 104a, b can have a high resistance (a.k.a., low voltage output or "0") or low resistance (a.k.a., high voltage output or "1").

Figure 2:
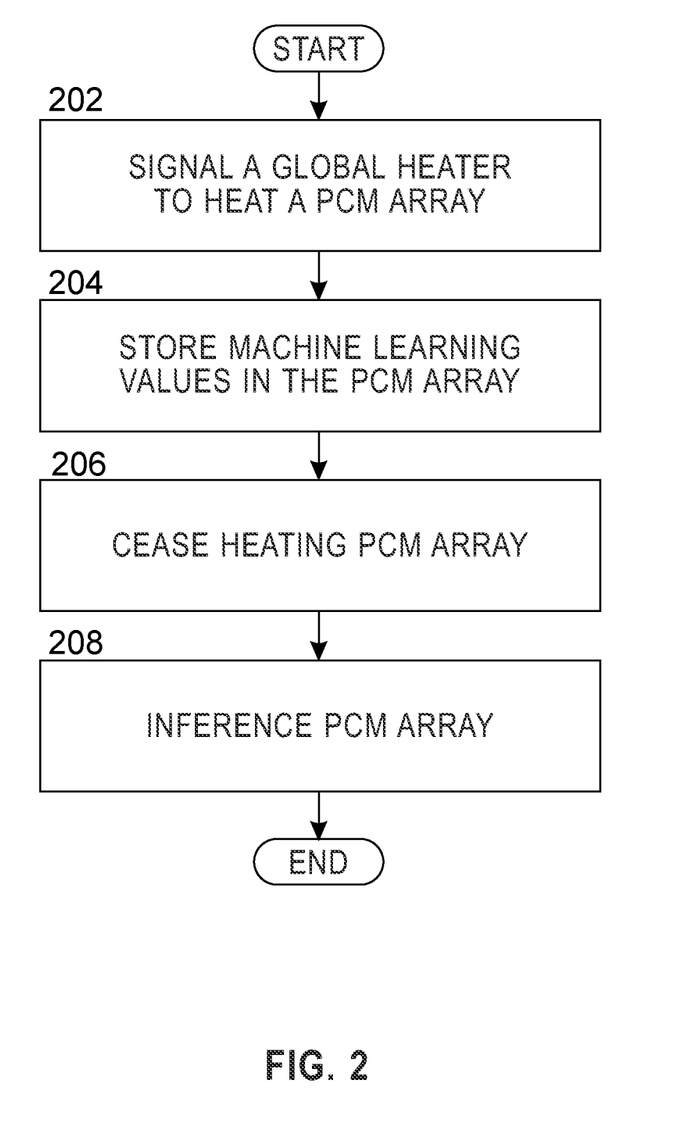
FIG. 2 depicts a flowchart of a workflow for using a PCM array in training a machine learning (ML) algorithm.

FIG. 2 is a flowchart of workflow depicting a method for using a PCM array in training a machine learning (ML) algorithm. An ML lifecycle can be broken up into two main, distinct parts. The first is the training phase, in which an ML model is created or "trained" by running a specified subset of data into the model. ML inference is the second phase, in which the model is put into action on live data to produce actionable output. The data processing by the ML model is often referred to as "scoring," so one can say that the ML model scores the data, and the output is a score.

The method of the workflow is performed on a semiconductor structure having a global heater like the semiconductor structure 100 illustrated in FIG. 1. In an embodiment, the workflow is performed by a training program that controls the signals to the wires (e.g., bottom wire 106, top wires 124a, b, and global heater wire 126 of FIG. 1) of the semiconductor structure. The training program signals a global heater to heat a phase change memory (PCM) array (block 202). As described above, the training program may control the heating of the PCM array so that the PCM materials have a temperature that is close to, but not above, a melting temperature for the PCM materials. The PCM array may be heated to a training temperature of 175° C., 160° C., or other temperature close to the crystallization temperature of the PCM materials. In certain embodiments, the training temperature may be 590° C., 575° C., or other temperature close to the melting temperature (600° C.) of the PCM materials.

The training program may also store ML values in the PCM array (block 204). The stored ML values are derived from training the ML algorithm, and are stored by propagating signals through each cell in the PCM array to melt the PCM materials and change a resistance of the cell. Training is the process of teaching a ML algorithm to perform a desired artificial intelligence task (e.g., image classification, converting speech into text) by feeding it data, resulting in a trained deep learning model. During the training process, known data is fed to the algorithm, and the algorithm makes a prediction about what the data represents. Any error in the prediction is used to update the strength of the connections between the artificial neurons, as stored by the resistance values of the PCM array. As the training process continues, the resistance values are further adjusted until the ML algorithm makes predictions with sufficient accuracy. The resistance values of each PCM cell in the PCM array may be adjusted with a lower current/voltage than would be required if the global heater did not heat the PCM array to the training temperature.

When the training completes, the training program signals the global heater to cease heating the PCM array (block 206). The heating is controlled by signals to the global heater wire, and when the training program ceases sending the heating signal, the global temperature of the semiconductor structure falls back down from the heated training temperature. The resistance values that are stored in the PCM array are more resistant to noise when the global temperature is reduced, due to the greater energy required to change the phase state of the PCM materials. With the lowered temperature, the training program inferences the PCM array (block 208). ML inference is the process of running live data points into the machine learning algorithm to calculate an output. When the ML is running in production, it is often then described as artificial intelligence (AI) since it is performing functions similar to human thinking and analysis. Machine learning inference basically entails deploying a software application into a production environment, as the ML model is typically just software code that implements a mathematical algorithm.

Figure 3:
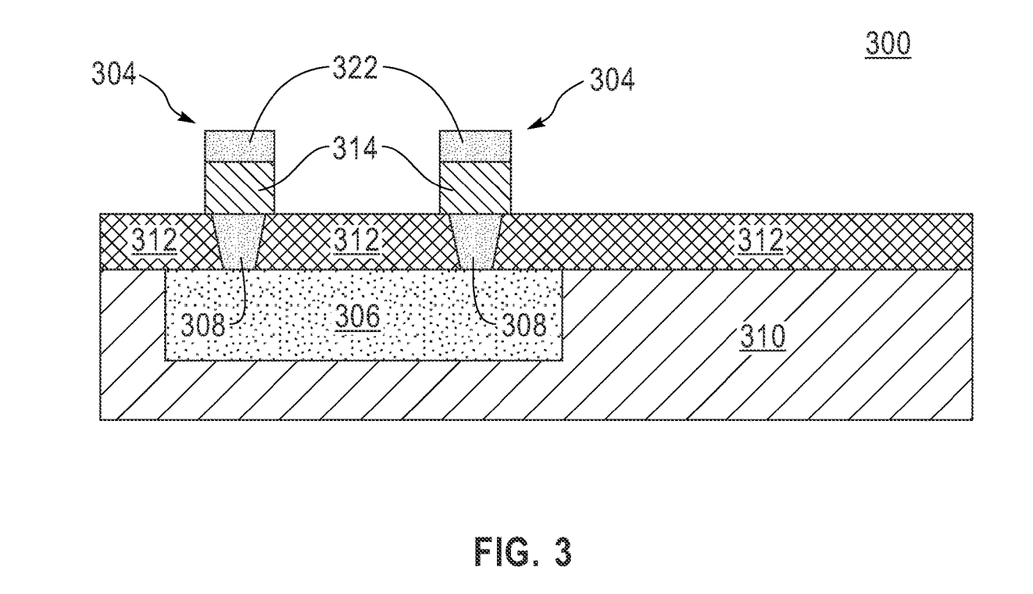
FIG. 3 depicts a cross-sectional side view of a semiconductor structure, in accordance with one embodiment of the present invention.

FIGS. 3-6 depict cross-sectional side views of a process of fabricating a semiconductor device 300, in accordance with an embodiment of the present invention. FIG. 3 is a cross-sectional view of an embodiment of a semiconductor structure 300 in mid-manufacture, such as after formation of a plurality of PCM cells 304. Each PCM cell in the plurality of PCM cells may include a top electrode 322, a resistive element 314, and a bottom electrode 308. The PCM cells 304 are formed on a substrate 310 and a bottom wire 306. The bottom electrodes 308 may be formed by etching a hole in an insulator 312 and filling in the hole with a high-resistivity metal. The high-resistivity metal may include, for example, titanium nitride, tantalum nitride, or combinations thereof. The resistive element 314 and the top electrode 322 may be formed as blanket layers followed by patterning and etching.

Figure 4:
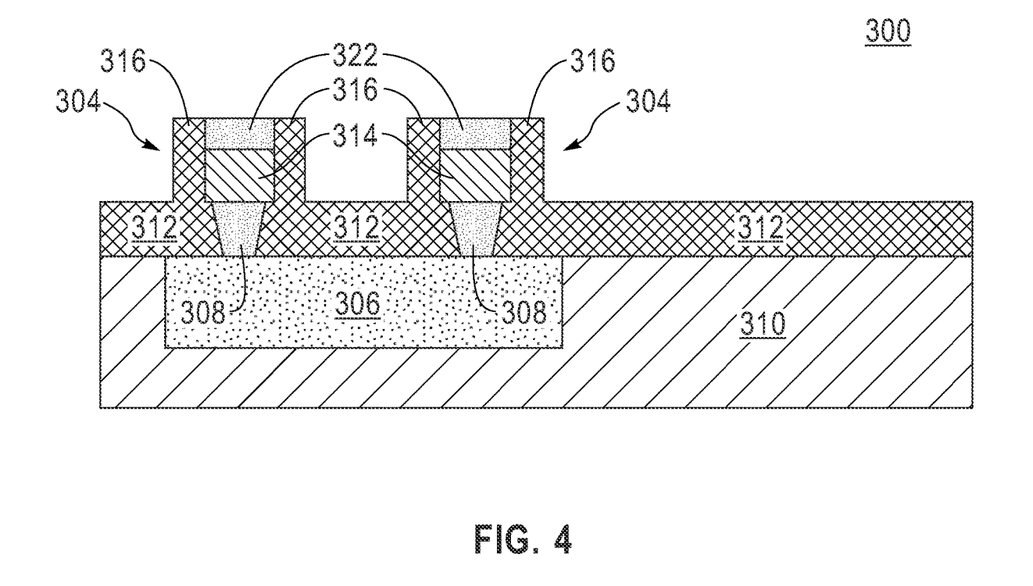
FIG. 4 depicts a cross-sectional side view of the semiconductor structure of FIG. 3 at a subsequent fabrication stage, in accordance with one embodiment of the present invention.

FIG. 4 is a cross-sectional view of the semiconductor structure 300 in mid-manufacture, such as after formation of spacers 316 surrounding the PCM cells 304. The spacers 316 insulate and protect the PCM cells 304 during subsequent steps of the fabrication of the semiconductor structure 300. The spacers 316 are formed using a deposition and etch back technique whereby a blanket of spacer material (e.g., silicon nitride) is deposited as a blanket layer over the semiconductor structure 300 and then etched from the more horizontal portions such that only the more vertical portions of the semiconductor structure 300.

Figure 5:
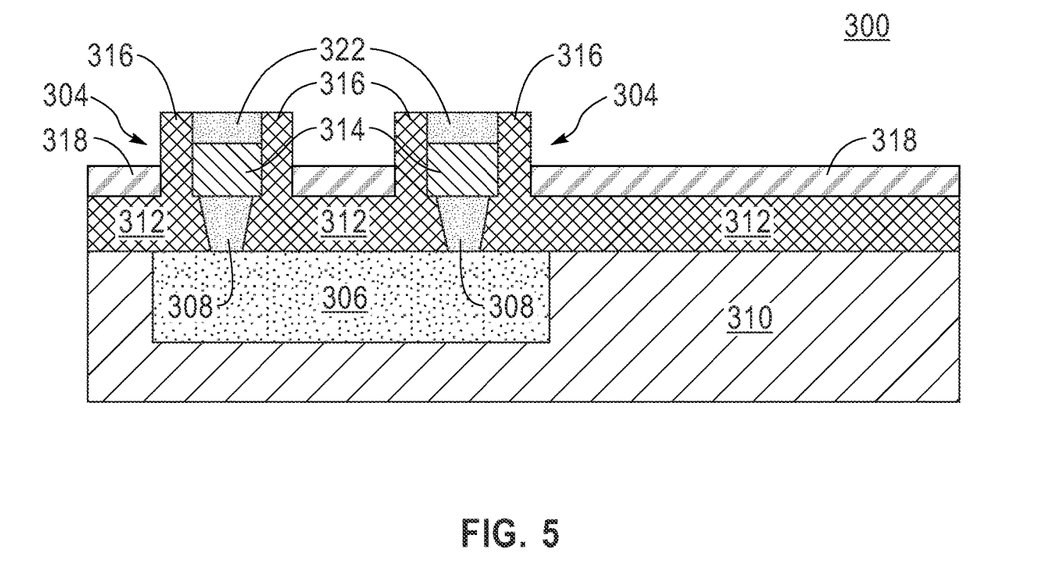
FIG. 5 depicts a cross-sectional side view of the semiconductor structure of FIG. 3 at a subsequent fabrication stage, in accordance with one embodiment of the present invention.

FIG. 5 is a cross-sectional view of the semiconductor structure 300 in mid-manufacture, such as after the formation of a global heater 318. The global heater 318 may be formed of a high-resistivity metal that warms when a current is applied and flows through the global heater 318. The high-resistivity metal may include, for example, titanium nitride, tantalum nitride, or combinations thereof. The global heater 318 may be formed by applying a blanket layer on the insulator 312. After application of the blanket layer, the top surface of the global heater 318 may be recessed below a top surface of the spacers 316.

Figure 6:
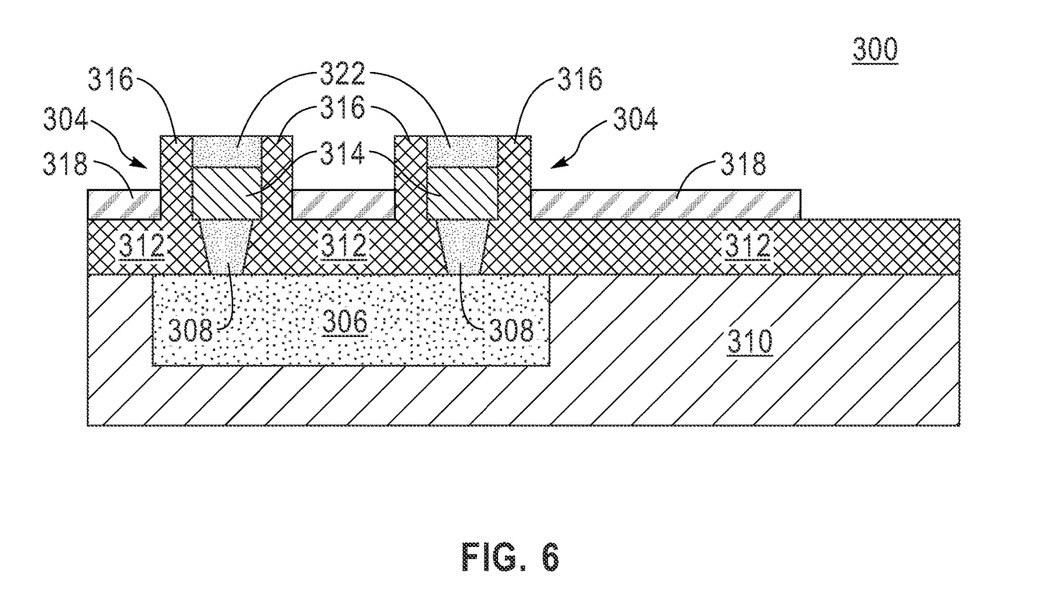
FIG. 6 depicts a cross-sectional side view of the semiconductor structure of FIG. 3 at a subsequent fabrication stage, in accordance with one embodiment of the present invention.

FIG. 6 is a cross-sectional view of the semiconductor structure 300 in mid-manufacture, such as after patterning and etching away at least part of the layer of high-resistivity metal of the global heater 318. Semiconductor lithography can be the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory (PCM) array, comprising:
a plurality of PCM cells, wherein each PCM cell in the plurality of PCM cells comprises a top electrode, a resistive element, and a bottom electrode; and a global heater comprising a thermally conductive material, the thermally conductive material surrounding the resistive elements of the plurality of PCM cells, wherein the global heater is configured to receive an electric signal to heat the plurality of PCM cells simultaneously.

2. The PCM array of claim 1, wherein the bottom electrode comprises a high-resistivity metal selected from the group consisting of: titanium nitride, tantalum nitride, and combinations thereof.

3. The PCM array of claim 1, wherein the thermally conductive material is selected from the group consisting of: titanium nitride, tantalum nitride, and combinations thereof.

4. The PCM array of claim 1, wherein each PCM cell in the plurality of PCM cells comprises a spacer formed along sidewalls of the resistive elements and the top electrodes of the PCM cell.

5. The PCM array of claim 4, wherein a top surface of the global heater is recessed below a top surface of the spacers.

6. The PCM array of claim 1, further comprising a via configured to provide current to the global heater.

7. The PCM array of claim 1, wherein the bottom electrode protrudes into a nitride layer, and the global heater is formed on a top surface of the nitride layer.

8. The PCM array of claim 1, wherein the PCM cells change from a first phase to a second phase depending on a signal heating the bottom electrode.

9. A method, comprising:
    forming a plurality of phase change memory (PCM) cells, wherein each PCM cell in the plurality of PCM cells comprises a top electrode, a resistive element, and a bottom electrode; and
    forming a global heater comprising a thermally conductive material, the thermally conductive material surrounding the resistive elements of the plurality of PCM cells, wherein the global heater is configured to receive an electric signal to heat the plurality of PCM cells simultaneously.

10. The method of claim 9, wherein forming the bottom electrode comprises etching a hole in a nitride layer and filling in the hole with a high-resistivity metal.

11. The method of claim 10, wherein the high-resistivity metal comprises a selection from the group consisting of: titanium nitride, tantalum nitride, and combinations thereof.

12. The method of claim 10, wherein forming the global heater comprises forming a layer of high-resistivity metal on a top surface of the nitride layer.

13. The method of claim 12, further comprising patterning and etching away at least part of the layer of high-resistivity metal.

14. The method of claim 9, further comprising forming spacers along sidewalls of each resistive element and top electrode of the plurality of PCM cells.

15. The method of claim 14, wherein a top surface of the global heater is recessed below a top surface of the spacers.

16. A method, comprising:
    signaling a global heater to heat a phase change memory (PCM) array, wherein the global heater comprises a thermally conductive material surrounding resistive elements of the plurality of PCM cells;
    storing machine learning values in the PCM array by propagating a signal through PCM cells of the PCM array to change resistance of the PCM cells;
    signaling the global heater to cease heating the PCM array; and
    inferencing the PCM array.

17. The method of claim 16, wherein the thermally conductive materially comprises a high-resistivity metal.

18. The method of claim 16, wherein training the PCM array comprises heating a local heater for each of the PCM cells of the PCM array.

19. The method of claim 16, wherein training the PCM array comprises changing at least one of the PCM cells from a first phase to a second phase.

20. The method of claim 19, wherein the first phase is an amorphous phase and said second phase is a crystalline phase.

* * * * *